United States Patent [19]

Yankielun et al.

[11] Patent Number: 5,648,724

[45] Date of Patent: Jul. 15, 1997

[54] METALLIC TIME-DOMAIN REFLECTOMETRY ROOF MOISTURE SENSOR

[75] Inventors: Norbert E. Yankielun, Lebanon, N.H.; Stephen N. Flanders, Norwich, Vt.

[73] Assignee: U.S. Army Corps of Engineers as represented by the Secretary of the Army, Washington, D.C.

[21] Appl. No.: 598,312

[22] Filed: Feb. 8, 1996

[51] Int. Cl.⁶ .......................... G01N 27/00; G01R 31/11
[52] U.S. Cl. .................. 324/533; 324/532; 324/557; 340/605
[58] Field of Search ...................... 324/532, 533, 324/534, 535, 643, 527, 557, 694; 340/604, 605

[56] References Cited

U.S. PATENT DOCUMENTS

| | | |
|---|---|---|
| 3,824,460 | 7/1974 | Gustafson . |
| 3,967,197 | 6/1976 | Anderson ................... 324/689 |
| 4,023,412 | 5/1977 | Luke et al. .................. 324/534 |
| 4,317,996 | 3/1982 | Davis . |
| 4,386,231 | 5/1983 | Vokey . |
| 4,502,044 | 2/1985 | Farris et al. . |
| 4,513,200 | 4/1985 | Manuin et al. .............. 250/227 |
| 4,532,469 | 7/1985 | Wardell ....................... 324/689 |
| 4,565,965 | 1/1986 | Geesen . |
| 4,598,273 | 7/1986 | Bryan, Jr. et al. .......... 340/539 |
| 4,797,621 | 1/1989 | Anderson et al. . |
| 4,846,547 | 7/1989 | Falco et al. ................. 350/96.29 |
| 4,924,174 | 5/1990 | Sheahan ...................... 324/696 |
| 4,965,554 | 10/1990 | Darling . |
| 4,968,880 | 11/1990 | Beller ......................... 250/227.21 |
| 5,026,141 | 6/1991 | Griffiths ..................... 350/96.24 |
| 5,081,422 | 1/1992 | Shih . |
| 5,134,377 | 7/1992 | Reddy, III et al. . |
| 5,138,153 | 8/1992 | Gensely et al. ............. 250/227.21 |
| 5,164,588 | 11/1992 | Marcus ....................... 250/227.21 |
| 5,177,996 | 1/1993 | Sahakian .................... 324/533 |
| 5,193,390 | 3/1993 | Nill, Jr. . |
| 5,212,453 | 5/1993 | Koehler et al. . |
| 5,262,639 | 11/1993 | Vokey et al. ................ 250/227.15 |
| 5,349,182 | 9/1994 | Vokey et al. ................ 250/227.21 |
| 5,410,255 | 4/1995 | Bailey . |
| 5,420,517 | 5/1995 | Skaling et al. . |
| 5,430,815 | 7/1995 | Shen et al. .................. 385/13 |
| 5,442,434 | 8/1995 | Liao et al. ................... 356/73.1 |
| 5,459,403 | 10/1995 | Kohler et al. . |

FOREIGN PATENT DOCUMENTS 0026239   2/1983   Japan ........................ 324/534

*Primary Examiner*—Glenn W. Brown
*Attorney, Agent, or Firm*—Luther A. Marsh

[57] ABSTRACT

An apparatus for detecting the presence, location, and extent of the moisture in a roof using metallic time-domain reflectomerry (TDR) includes an electrical pulses, a transmission line embedded within the roof and connected with the pulse generator, and a signal analyzer which interprets the electrical pulses transmitted along the transmission line. When the transmission line is exposed to moisture, the dielectric constant of the transmission line changes, thereby causing a portion of the energy of the transmitted pulse to be reflected back toward the source and a portion to pass through to the end of transmission line. The distance from the source and the length of the dielectric discontinuity are determined by analyzing the round-trip travel time of the reflected pulse.

8 Claims, 1 Drawing Sheet

METALLIC TIME-DOMAIN REFLECTOMETRY ROOF MOISTURE SENSOR

BACKGROUND OF THE INVENTION

The present invention relates to moisture sensors and, more particularly, to a metallic time-domain reflectometry (TDR) moisture sensing apparatus for detecting the location of leaks in a roof.

Leaks are the primary source of roof problems. Especially in low-slope roofs, leaks can lead to water accumulation and damage to the roof. Accumulation of condensation presents a similar problem. Since damage resulting from leaks may become severe before the leak is detected by the occupants of the building, early detection is necessary in order to repair the source of the problem before major damage occurs.

BRIEF DESCRIPTION OF THE PRIOR ART

Currently available non-destructive methods for detecting roof leaks utilize infrared thermographic and nuclear moisture meter detection. Both of these techniques require a team of people to go on the roof (or above it for aerial thermography) to look for problems. Each method detects moisture indirectly via the level of heat being released or by the backscatter of slow neutrons from hydrogen atoms, and they provide no information until they are scheduled and completed.

Various devices are known in the patented prior art for detecting leaks in roofs. The U.S. patent to Farris et al U.S. Pat. No. 4,502,044, for example, discloses a systems for detecting the presence of moisture in a given location, such as the attic of a building or house, before the moisture has had an opportunity to cause damage. The detector of this system includes a grid of extensions arranged on a fabric backing sheet which ordinarily exhibits a high impedance. When a leak occurs, moisture wets the backing sheet and bridges a space between the extensions, thereby reducing the impedance of the grid. This reduced impedance indicates the presence of moisture and causes an alarm to sound. This system does not indicate the location of the source of the moisture. The U.S. patent to Bryan, Jr. et al U.S. Pat. No. 4,598,273 discloses a wireless leak detection system for roofs which uses water-activated batteries to operate moisture sensors placed at various locations on a roof. The batteries have a limited shelf life and once exposed to water, remain active until completely discharged. In addition, the system will only detect leaks which occur at the discrete locations of a sensor. A large number of sensors is therefore needed to accurately monitor the entire roof for leaks.

It is also known in the patented prior art to use time-domain reflectomerry (TDR) to detect leaks. The U.S. patent to Reddy, III. et al, for example, discloses a complex leak detection system for detecting leaks from a storage tank and pipeline containing fuel oil. The U.S. patent to Bailey U.S. Pat. No. 5,410,255 discloses a method and apparatus for detecting and locating leaks and determining whether the leaking liquid is a non-conductive liquid such as a hydrocarbon or a conductive liquid such as water. Neither of these patents discloses a system using metallic TDR for quickly and accurately detecting the presence and location of a leak in a roof.

The present invention was developed in order to overcome these and other drawbacks of the prior devices by providing a moisture sensing apparatus which uses metallic TDR to detect the presence and location of moisture in a roof. The apparatus includes an electrical pulse generator-receiver which produces and transmits a series of electrical pulses along a transmission line arranged within the roof which is connected with the pulse generator-receiver, and a signal analyzer which analyzes the electrical pulses transmission line is locally exposed to moisture, the dielectric constant of the locality changes, thereby causing a portion of the energy of the transmitted pulse to be reflected back toward the source. The distance from the source and the length of the dielectric discontinuity are determined by measuring the round-trip travel time of the reflected pulse.

SUMMARY OF THE INVENTION

Accordingly, a primary object of the present invention is to provide an inexpensive and easy to operate device for detecting the presence and location of moisture in a roof.

It is a more specific object of the invention to provide a roof moisture sensor which uses time-domain reflectometry (TDR) to determine the location of the moisture. The apparatus includes an electrical pulse generator-receiver which produces and transmits a series of electrical pulses, a transmission line embedded within the roof which is connected with the interprets a portion of the electrical pulses reflected back to the source from moisture in the vicinity of the transmission line.

It is another object of the invention to provide a roof moisture sensor which allows both the location and extent of the leak to be evaluated.

It is a further object of the present invention to provide a roof moisture sensor which offers frequent monitoring and is capable of self-checking for correct operation.

It is yet another object of the present invention to provide a roof moisture sensor which recovers to a normal inactivated reading when the roof drys.

BRIEF DESCRIPTION OF THE DRAWINGS

Other objects and advantages of the invention will become apparent from a study of the following specification when viewed in light of the accompanying drawings, in which.

DETAILED DESCRIPTION

Figure 1A:
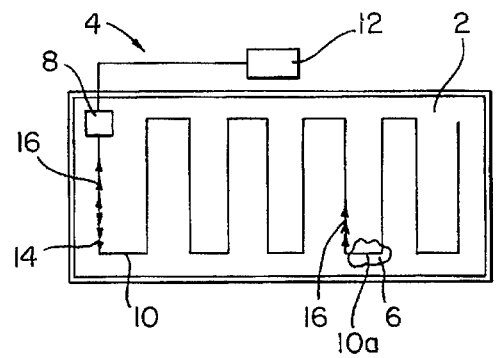
FIGS. 1a, 1b, and 1c are schematic diagrams of a roof incorporating a roof moisture sensor according to the invention.

Referring first to FIG. 1a, there is shown a roof 2 having an apparatus 4 for detecting moisture 6. The apparatus includes a pulse generator-receiver 8, a transmission line 10, and a signal analyzer 12. Pulse generator-receiver 8 produces and transmits a periodic series of narrow electrical pulses or sharp level transitions or pulses indicated by reference numeral 14. Pulses 14 travel along transmission line 10 until they encounter a portion 10a which is exposed to moisture 6 at which point a portion 16 of the energy of transmitted pulses 14 is reflected back toward the pulse generator-receiver 8.

Signal analyzer 12 displays and/or interprets the timing of the pulse propagation along the transmission path, thereby establishing the location of the water along the transmission line. In addition, the extent of the water can be determined from the form of the reflected pulse. Alternatively, the signal analyzer can be an alarm which is activated when the transmission line encounters water.

Figure 1B:
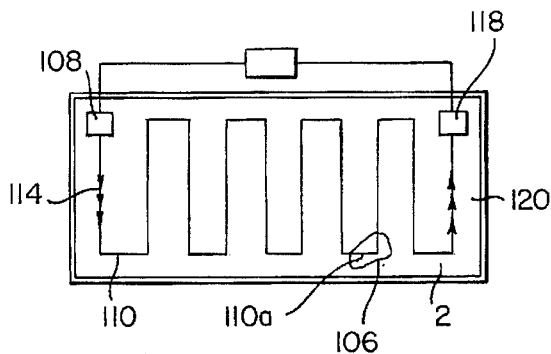

FIG. 1b shows an alternate moisture sensing apparatus in which a separate pulse receiver 118 is connected with the remote end of the transmission line 110. In this system, the power level of the pulses 114 produced and transmitted from the pulse generator 108 can be continuously monitored and compared with either the reflected power level, as in FIG. 1a, or compared with the pulse signal 120 received at the remote end of the transmission line. Pulse signal 120 represents the portion of the original pulse 114 which has passed through the entire transmission line including that portion 110a exposed to water 106. In some cases, it may be necessary to compare the signal produced by the pulse generator with a template that represents normal operation under prevailing environmental conditions.

In the configurations shown in FIGS. 1a and 1b, the transmission lines 10, 110, respectively, are arranged in a serpentine pattern which traverses the length and width of the roof 2.

Figure 1C:
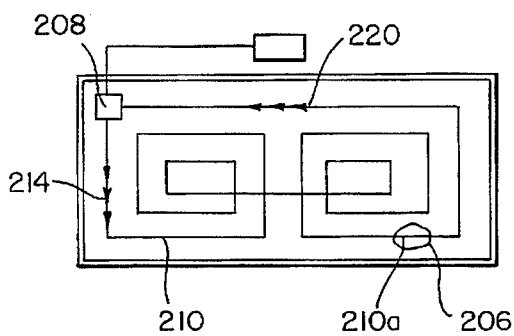

FIG. 1c shows a third configuration in which the remote end of the transmission line 210 is connected with the pulse generator-receiver 208. This configuration operates in a manner similar to that of the system shown in FIG. 1b except that the pulse generating and receiving functions are combined into a single unit as opposed to separate units. Accordingly, pulses 214 are generated and transmitted along transmission line 210, through portion 210a exposed to water 206, and portion 220 of the original pulse signal is directed back to pulse generator-receiver 208. Transmission line 210 is arranged in a box-like spiral or concentric coil pattern. Two such spirals are shown but any number could be used depending on the geometry of the roof.

Figure 2:
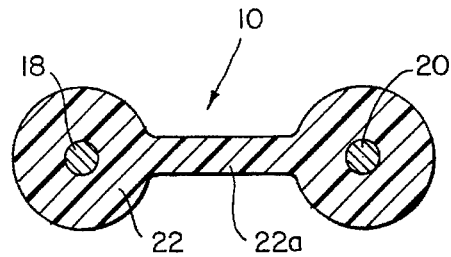
FIG. 2 is a sectional view of a twin-lead transmission line.

FIG. 2 shows in cross-section a transmission line 10 having a twin-lead configuration which includes a pair of parallel, spaced, conductive sensing wires 18, 20 separated by and surrounded with an insulating medium 22, such as plastic, which has a dielectric constant that changes in the presence of moisture. A spacer 22a provides uniform parallel spacing between the conductive sensing wires 18 and 20. When the transmission line is exposed to water, the water pools between and around conducting wires 18, 20, thereby creating changes in the local dielectric constant and transmission characteristics. This discontinuity, in turn, causes a portion of the energy of the transmitted pulses to be reflected back toward the source and allows a portion to pass. By detecting and interpreting the reflected portion or the transmitted portion, the location and extent of the moisture can be determined. It will be recognized that when the roof drys, the sensing apparatus will return to a normal inactivated condition.

Figure 3:
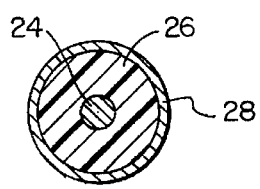
FIG. 3 is a sectional view of a coaxial transmission line.

FIG. 3 shows a coaxial configuration for the transmission line which includes an inner conductive sensing wire 24 surrounded by a porous dielectric medium 26 which is surrounded by an outer conductive layer 28, such as a braided wire mesh. With this arrangement, water seeps into the porous medium 26 between the inner conductor 24 and braided outer conductor 28, whereby the dielectric constant of the porous medium and the transmission characteristics of the transmission line are changed.

Figure 4:
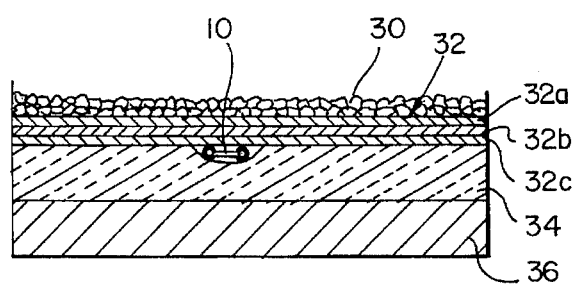
FIG. 4 is a sectional view illustrating the placement of a transmission line in a roof.

Referring now to FIG. 4, there is shown a cross-section of a roof incorporating the roof sensor. The roof includes a top ballast layer 30 formed of, for example, gravel and tar, a water proof membrane layer 32 formed of, for example, a plurality of asphalt covered roofing felts 32a, 32b, 32c and a layer of insulation 34 which may be water permeable, such as fiber glass, or water impermeable, such as plastic foam. Insulating layer 34 is arranged on the ceiling 36 of the building. A transmission line 10 is arranged between the waterproof membrane 32 and the insulation layer 34. It will be recognized that various roof constructions exist and that the transmission line can be arranged between different layers. For example, if the roof construction includes a water impermeable layer of insulation arranged above the waterproof membrane, the transmission line is arranged below both of these layers.

While in accordance with the provisions of the Patent Statutes the preferred forms and embodiments of the invention have been illustrated and described, it will be apparent to those of ordinary skill in the art that various changes and modifications may be made without deviating from the inventive concept set forth above.

What is claimed is:

1. Apparatus for detecting moisture in a roof, comprising:

(a) electrical pulse generating means for transmitting and receiving a series of electrical pulses;

(b) a transmission line arranged within the roof and connected with said pulse generating means, said transmission line having first and remote ends and including a medium having a dielectric constant which changes when exposed to moisture; and (c) signal analyzing means connected with said pulse generating means for interpreting said series of electrical pulses transmitted along said transmission line, whereby when said transmission line is exposed to moisture, a portion of said electrical pulses transmitted along said transmission line is analyzed by said signal analyzing means thereby allowing the presence and location of the moisture in the roof to be determined.

2. Apparatus as defined in claim 1, wherein said electrical pulse generating means includes a pulse generator connected with said first end of said transmission line and a pulse receiver connected with said remote end of said transmission line.

3. Apparatus as defined in claim 1, wherein said first and remote ends of said transmission line are connected with said electrical pulse generating means.

4. Apparatus as defined in claim 1, wherein said transmission line is arranged in a serpentine pattern.

5. Apparatus as defined in claim 1, wherein said transmission line is arranged in a concentric coil pattern.

6. Apparatus as defined in claim 1, wherein said transmission line includes a pair of generally parallel laterally-spaced conductive sensing wires surrounded with a medium having a dielectric constant which changes in the presence of moisture.

7. Apparatus as defined in claim 1, wherein said transmission line includes a porous dielectric medium interposed between an inner conductive member and an outer conductive layer.

8. Apparatus as defined in claim 1, wherein said signal analyzing means comprises an alarm.

* * * * *